(12) United States Patent
Takagi

(10) Patent No.: US 6,867,147 B2
(45) Date of Patent: Mar. 15, 2005

(54) METHOD OF SURFACE TREATMENT OF SEMICONDUCTOR

(75) Inventor: Mikio Takagi, Kawasaki (JP)

(73) Assignee: F.T.L. Co., LTD, Lawasalo (JP)

( * ) Notice: Subject to any disclaimer, the term of this patent is extended or adjusted under 35 U.S.C. 154(b) by 267 days.

(21) Appl. No.: 10/240,261
(22) PCT Filed: Mar. 28, 2001
(86) PCT No.: PCT/JP01/02548
§ 371 (c)(1), (2), (4) Date: Dec. 11, 2002
(87) PCT Pub. No.: WO01/73832
PCT Pub. Date: Oct. 4, 2001

(65) Prior Publication Data
US 2003/0148621 A1 Aug. 7, 2003

(30) Foreign Application Priority Data
Mar. 29, 2000 (JP) .......................................... 2000-90884

(51) Int. Cl.[7] ...................... H01L 21/302; H01L 21/461
(52) U.S. Cl. ........................ 438/714; 438/719; 438/723
(58) Field of Search ........................ 438/52, 404, 337, 438/410, 412, 714, 719, 723

(56) References Cited

U.S. PATENT DOCUMENTS

| | | | | |
|---|---|---|---|---|
| 5,460,691 A | * | 10/1995 | Kobayashi et al. | 438/743 |
| 5,556,275 A | * | 9/1996 | Sakata et al. | 432/241 |
| 5,607,515 A | * | 3/1997 | Takahashi | 134/18 |
| 5,775,889 A | * | 7/1998 | Kobayashi et al. | 432/18 |
| 6,171,982 B1 | * | 1/2001 | Sato | 438/795 |
| 6,204,194 B1 | * | 3/2001 | Takagi | 438/758 |

FOREIGN PATENT DOCUMENTS

| | | | | |
|---|---|---|---|---|
| JP | 5214531 | * | 8/1993 | ........... C23C/16/00 |
| JP | 5217987 | * | 8/1993 | ......... H01L/21/304 |
| JP | 06120188 | * | 4/1994 | ......... H01L/21/304 |

* cited by examiner

Primary Examiner—Duy-Vu N. Deo
(74) Attorney, Agent, or Firm—Stites & Harbison PLLC; Ross F. Hunt, Jr.

(57) ABSTRACT

A method of removing native oxide film from contact holes of a semiconductor device by using a microwave-excited reactive gas. The method increases throughput. Reactive gas is introduced substantially horizontally into the reactor (20) by way of a chamber (5, 22) arranged as an extension thereof in the vertical direction of the reactor (20) and showing an internal pressure higher than that of the reactor, while the plurality of semiconductor silicon wafers (10) that are arranged in the vertical direction and held to temperature not higher than 323 K are being rotated, and subsequently said reactor is heated (30) to above 373 K.

9 Claims, 4 Drawing Sheets

METHOD OF SURFACE TREATMENT OF SEMICONDUCTOR

BACKGROUND OF THE INVENTION

1. Technical Field

The present invention relates to a method of surface treatment of semiconductor. More particularly, the present invention relates to a dry etching method of removing native oxide film formed on the silicon exposed in a contact hole of a semiconductor device to be used for burying an electrode material such as polysilicon, doped polysilicon, metal, $TiSi_2$, $WSi_2$ or TiN and/or scum produced as a result of the reaction of resist and silicon in a process of manufacturing a semiconductor device on a silicon wafer.

2. Background Art

The native oxide film formed in a contact hole is used to be removed by chemical dry etching or IPA (isopropyl alcohol) cleaning in early days. However, such a method is no longer adaptable to the current situation where contact holes are remarkably downsized and large aspect ratios are adopted.

Japanese Patent Application Laid-Open Publication No. 5-275392 discloses a single wafer native oxide film removing device to be used for semiconductor silicon wafers (to be referred to simply as "wafer" hereinafter). According to the above identified patent document, the native oxide film is etched off by causing a plasma-excited mixture gas of $NF_3$ and $H_2$ to flow into a downstream reactor, while cooling the wafer to about 173 K (−100° C.) by way of a susceptor. The etching process can be suspended when $(NH_4)_2SiF_6$ or a similar substance is formed on the wafer. Then, the wafer is irradiated with inactivated Ar plasma in order to make the etching process start again.

A method of etching off $SiO_2$ (native oxide film) by using $NF_3$ and $NH_3$ has also been disclosed (1999 DRY PROCESS SYMPOSSIUM, In-situ observation of Si Native Oxide Removal Employing Hot $NH_3/NF_3$ Exposure, Ogawa et al. pp. 273–278). According to the above identified paper, the native oxide film formed on a wafer is removed by dissociating $(NH_4)_2SiF_6$ at temperature exceeding 100° C. The paper also says that the reaction product may probably be $NH_4F \cdot HF$ or $NH_4F$. In the following description, the reaction product of the source gas is referred to as etching gas.

With the known single wafer native oxide film removing method, the reaction time including a cooling operation, a plasma etching operation and an operation of removing the reaction product is about four minutes per wafer. Then, the total time required for the reaction including the overhead time of introducing and drawing out the wafer is about seven minutes. Thus, the overall process of removing the native oxide film inevitably includes the overhead time of letting each wafer in and out to consequently give rise to a bottle neck for the manufacturing line. While this sort of problem may be avoided when a vertical batch method such as a low pressure CVD (LPCVD) method is used for removing the native oxide film, no such method has been proposed to date. Additionally, with the conventional single wafer native oxide film removing method, it is indispensable to cool the wafer to below 293 K by way of a susceptor in order to reduce the time required for the treatment by raising the etching rate. Such a cooling technique by turn involves the use of a complicated cooling system.

DISCLOSURE OF THE INVENTION

Therefore, it is the object of the present invention to dissolve the above identified problems by providing a treatment method that can process more than 50 wafers at a time and, more particularly, more than 100 wafers within one to two hours with an enhanced level or reproducibility.

According to a first aspect of the present invention, there is provided a method of treating the surface of semiconductor by means of the reaction product of a first microwave-excited gas containing at least a gas selected from hydrogen, ammonia and nitrogen and a second gas of a fluorine-containing compound containing neither carbon nor oxygen in a reactor containing silicon wafers with native oxide film and/or scum formed in contact holes thereof, characterized in that said reaction product is introduced substantially horizontally into the reactor by way of a chamber arranged as an extension thereof in the vertical direction of the reactor and showing an internal pressure higher than that of the reactor, while many silicon wafers that are arranged in the vertical direction and held to temperature not higher than 323 K are being rotated, and subsequently said silicon wafers are heated to above 373 K.

In the method of the first aspect of the present invention, a first gas is introduced into a first chamber that (a) is arranged as an extension thereof in the vertical direction of the reactor and (b) has a plurality of first ejection ports arranged in row and held open relative to the second chamber as defined hereinafter, and a second gas is introduced into a second chamber that (c) is arranged as an extension thereof in the vertical direction of the reactor and (d) has a plurality of second ejection ports arranged in row and held open relative to the reactor, (e) the internal pressure of said second chamber being between that of the first chamber and that of the reactor.

In a second aspect of the present invention, there is provided a method of the category as defined above characterized in that a first gas is introduced into a first chamber that (a) is arranged as an extension thereof in the vertical direction of the reactor and (b) has a plurality of first ejection ports arranged in row and held open relative to the reactor and (c) the internal pressure of said first chamber being higher than that of the reactor, and a second gas is introduced into a second chamber that (d) is arranged as an extension thereof in the vertical direction of the reactor as and (e) has a plurality of second ejection ports arranged in row and held open relative to the reactor, (f) the internal pressure of said second chamber being higher than that of the reactor, while many silicon wafers that are arranged in the vertical direction and held to temperature not higher than 323 K are being rotated, and subsequently said silicon wafers are heated to above 373 K.

The present invention will be described further below.

The method according to the present invention is adapted to treat 50 to 150 wafers that are stacked in a vertical direction.

With the known single wafer native oxide film removing method, wafers are cooled typically to 173 K (−100° C.) in order to raise the etching rate. However, according to the invention, wafers do not require any particular cooling operation in the case of batch treatment because no throughput-related problem arises when the temperature is not higher than 323 K. If the temperature can rise above 323 K due to impedance mismatching of the microwave circuit, wafers are cooled preferably to temperature between 303 and 318 K by means of gasified liquid nitrogen according to the present invention because it is difficult to cool the wafers by means of a susceptor unlike the conventional method. According to the present invention, wafers are subjected to surface treatment in a temperature range between 253 and 323K because the lowest wafer temperature that can feasibly be used with the method of the present invention is 253 K, although the surfaces of wafers are normally treated in a temperature range between room temperature and 323 K. The wafer temperature can be controlled well with a satisfactory level of reproducibility when the cooling medium that is introduced into the reaction system is cooled to temperature sufficiently lower than the wafer temperature (not lower than 373 K) and the pressure of the reaction system and that of the exhaust pump are held to show a constant relationship.

The gas cooling may be replaced by indirect cooling of causing a cooling medium such as water to flow into the wall of the first and/or that of the second chamber to keep the temperature of the first gas and/or that of the second gas (whichever appropriate) not higher than 323K.

The (first and second) chambers to be used for etching according to the present invention may be tube or cabinets that can be made to show an internal gas pressure difference relative to each other and also relative to the reactor and into which gas can be made to flow and stored there so that it may flow subsequently. With such a pressure difference, radicals, molecules and atoms in the chambers are made to show a uniform distribution. Gas is made to flow toward a plurality of wafers with a uniform density when the internal gas pressure difference between the first chamber and the second chamber is 400 Pa (3 torr) to 1.3 KPa (10 torr). The chambers communicate with each other by way of a common through hole or with the reactor that is held under reduced pressure by way of independent respective through holes. A pressure difference can be produced by decreasing the diameters of the through holes. The internal gas pressure in the reactor is generally between 133 Pa (1 torr) and 400 Pa (3 torr).

Preferably, the first and second chambers are arranged in the vertical direction of the reactor as extensions thereof and made to have a length substantially same as overall height of the wafers that are stacked vertically in the reactor. Then, etching gas can be fed to the wafers uniformly with a minimal traveling distance. Preferably, each of the chambers is provided with a plurality of through holes arranged in the vertical direction thereof so that gas may be introduced substantially horizontally and gets to the surfaces of the wafers with a minimal traveling distance. The ejection ports of each of the chambers are arranged so as to correspond to the respective heights of the stacked wafers.

Either of the following modes of mixing the first gas and the second gas may be used for the purpose of the invention.

(a) The first gas and the second gas are mixed in the pipe leading to the chambers or the first gas is made to flow into the second chamber and the etching gas produced in the second chamber is ejected into the internal space of the reactor (in the first aspect of the invention). In this mixing mode, the internal pressure of the first chamber is made higher than that of the second chamber, while the internal pressure of the second chamber is made higher than that of the reactor. In this mixing mode, the second chamber needs to be arranged close to the wafers in the reactor, preferably with a gap not more than 2 cm separating them from each other.

(b) The first gas ejected from the first ejection ports and the second gas ejected from the second ejection ports are mixed and made to contact with each other in the internal space of the reactor (in the second aspect of the invention). In this mixing mode, the time required for the produced etching gas to contact the contact holes of the wafers is advantageously be reduced, although etching gas can flow as upper and lower branched streams to a relatively large extent.

In the case of 8- to 12-inch wafers, the native oxide film generally shows a film thickness of 20 angstroms or less with variances of 2 to 10 angstroms in the film thickness. If native oxide film is formed in contact holes to a film thickness between 0 and 5 angstroms, the surface is etched by 5 angstroms as target value. If the native oxide film has a large film thickness, argon is mixed with the first gas and the reaction rate is raised by way of microwave-excited argon.

Subsequently, after exhausting etching gas, the complex of $(NH_4)_2SiF_6$ or a similar substance is dissociated from the etching gas by heating the inside of the reactor above 373 K. As a result, the complex is removed and hydrogen termination (Si—H bond) is formed on the Si surface.

BEST MODE FOR CARRYING OUT THE INVENTION

Figure 1:
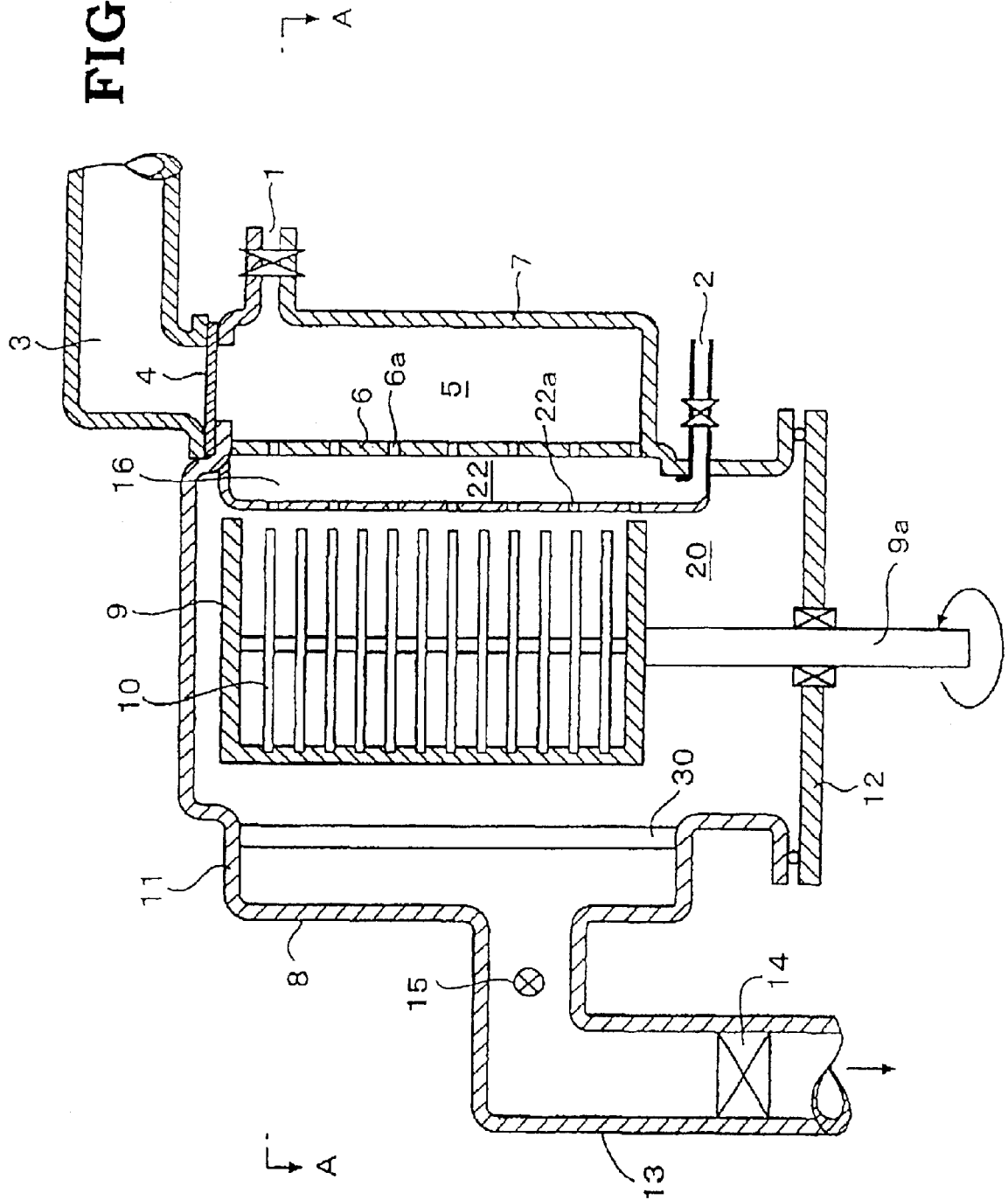
FIG. 1 is a schematic vertical cross sectional view of a device that can be used for carrying out the method according to the first aspect of the invention.
Figure 2:
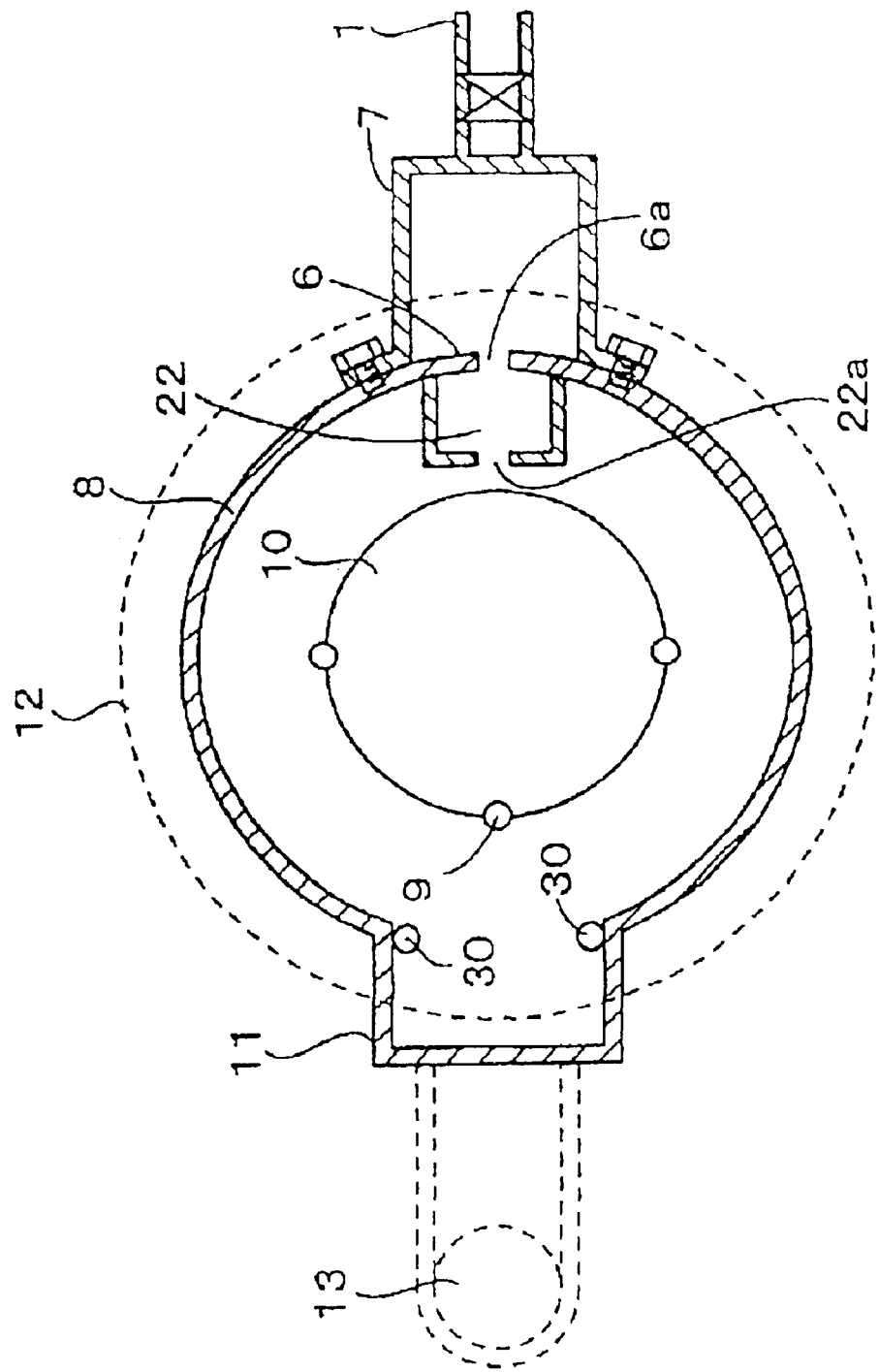
FIG. 2 is a schematic cross sectional view taken along line A—A in FIG. 1.
Figure 3:
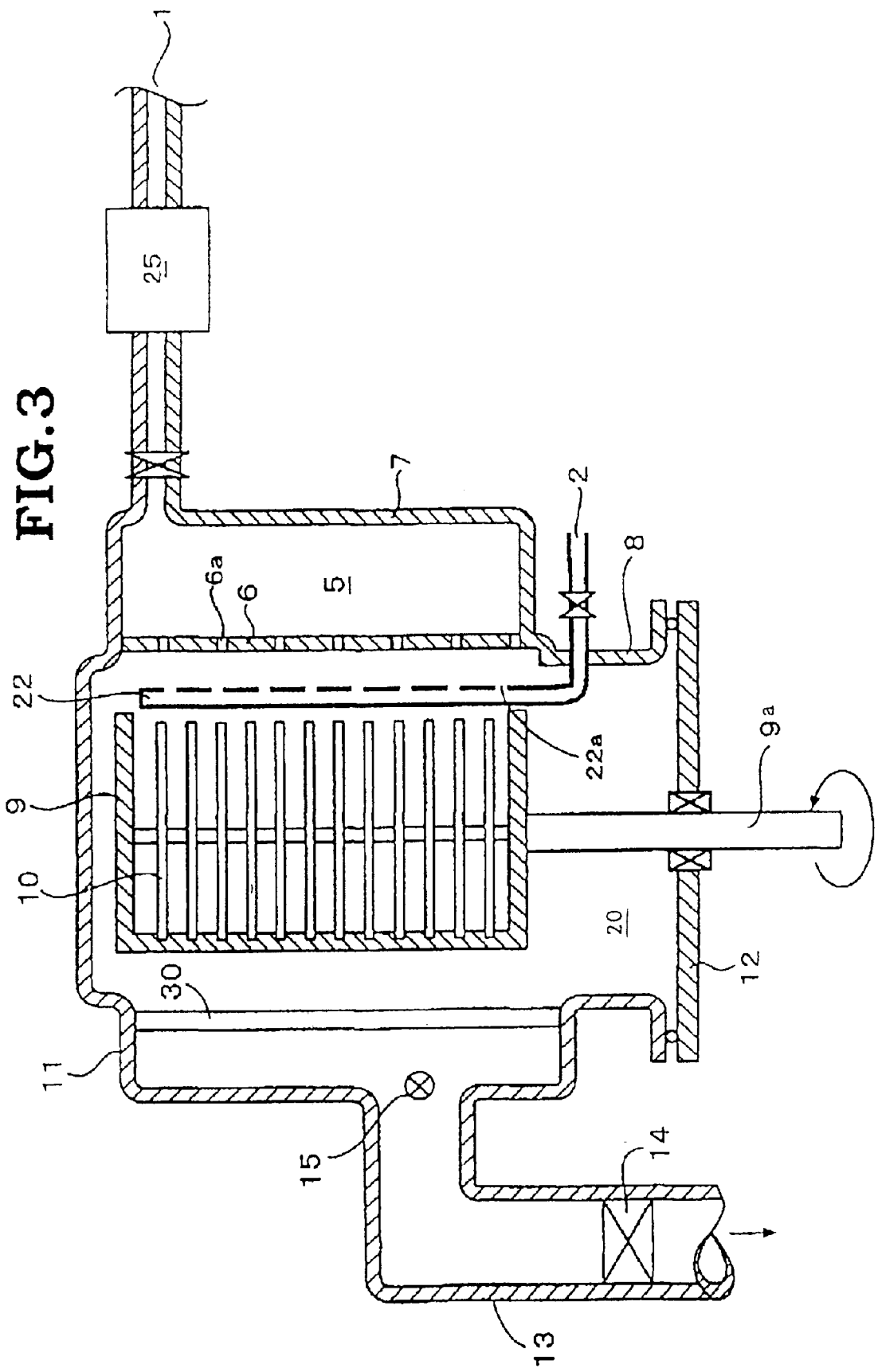
FIG. 3 is a schematic vertical cross sectional view of a device that can be used for carrying out the method according to the second aspect of the invention.

Now, the invention will be described in greater detail by referring to the accompanying drawings, of which FIGS. 1 and 2 illustrate the method according to the first aspect of the invention and FIG. 3 illustrates the method according to the second aspect of the invention.

FIGS. 1 and 2 show only a reduced number of wafers for the sake of simplicity and easy understanding. Referring to FIGS. 1 and 2, there are illustrated a first chamber 5 whose internal pressure is between about 0.8 KPa (5 torr) and about 1.3 KPa (10 torr), wafers 10, a reactor 20 whose internal pressure is between about 0.13 Pa ($10^{-3}$ torr) and about 1.3 KPa (10 torr) and a second chamber 22 whose internal pressure is between about 400 Pa (3 torr) and about 600 Pa (5 torr).

The reactor 20 is a structure of an aluminum tube 8 having a closed top and an open bottom that is closed by a bottom plate 12 and contains a plurality of 12-inch wafers 10 arranged vertically at intervals between 10 and 50 mm. The wafers are held vertically by means of a jig 9 that is rigidly secured to a rotary shaft 9a and adapted to be driven to rotate by the rotary shaft 9a in order to react uniformly with etching gas. The first gas that is typically a mixture gas of $H_2$ and $N_2$ is made to flow into the first chamber 5 through an inlet port 1 at a flow rate of 1 L/min, for instance, the internal pressure of the first chamber being typically held to a level between 665 Pa (5 torr) and 2.6 KPa (20 torr). In FIGS. 1 and 2, reference numerals 6 and 7 respectively denote a partition plate defining the first chamber 5 and an outer wall of the cabinet of the first chamber 5, which are made of an aluminum material so as to suppress production of microparticles. The first chamber 5 is provided at the top with a sapphire window 4 and the first gas in the inside of the first chamber is excited by a microwave that comes in through the sapphire window with an output power level of 400 W and a frequency of 2.45 GHz. In FIGS. 1 and 2, reference numeral 3 denotes a microwave guide tube. On the other hand, the second gas is made to flow into the second chamber 22 through inlet port 2 at a flow rate of 100 to 300 cc/min, the second chamber 22 being provided with partition walls including an electrically non-conductive aluminum oxide plate 16 and an aluminum plate 6. The first gas flows into the second chamber 22 by way of a plurality of vertically arranged through holes (first ejection ports) 6a having a diameter between 0.5 and 1.0 mm and then further into the reactor 20 by way of a plurality of vertically arranged through holes (second ejection ports) 22a. The through holes 22a and the wafers 10 are separated from each other by a distance between 10 and 20 mm and the number of through holes 22a is equal to or less than the number of wafers. Preferably, the number of through holes 22a is not less than ⅓ of the number of wafers.

In this gas introducing stage, etching gas flows substantially horizontally, although it may also flow slightly upwardly and downwardly, so that etching gas that is in the initial stages of generation and hence highly reactive is fed to the wafers 10. The rate at which native oxide film is removed is influenced by the intervals (d) of arrangement of the wafers particularly when the through holes 22a and the wafers 10 are separated from each other by a distance between 10 and 20 mm. The rate of removal of native oxide film is between 0.5 nm (5 angstroms) and 1 nm (10 angstroms)/min when d=15 to 30 mm. Since the silicon/native oxide film etching selectivity is about 1/6, it is not necessary to provide large contact if etching shows large variances. After the reaction, etching gas is temporarily collected in a cabinet 11 extending outwardly from the reactor 20 and subsequently exhausted by way of an exhaust pipe 13 and a valve 14 linked to a pump. In FIG. 1, reference numeral 15 denotes a pressure gauge.

The wafers 10 in the reactor 20 may be cooled to a temperature level not higher than room temperature by causing cooling gas such as gasified liquid nitrogen to flow into the reactor 20 by way of the gas inlet port 1 and/or the gas inlet port 2 or a specifically provided gas inlet port (not shown). Additionally, after the reaction, the dissociation of complex is boosted and production of particles is prevented when the wafers 10 in the reactor 20 are heated to about 373 K by means of a lamp 30 arranged in the reactor 20. Alternatively, the wafers 10 may be moved into a separate device for heating.

FIG. 3 is a schematic vertical cross sectional view of a device that can be used for carrying out the method according to the second aspect of the invention. In FIG. 3, the components that are same as or similar to their counterparts of FIGS. 1 and 2 are denoted respectively by the same reference symbols. As shown in FIG. 3, the second chamber 22 is arranged near the first chamber 5 in the reactor 10 with a gap of about 5 to 10 mm separating them from each other. In FIG. 3, reference numeral 25 denotes a microwave generator.

The first gas and the second gas are mixed with each other on the way of flowing horizontally to produce etching gas, which is then made to react with the wafers 10 in the reactor as it is drawn to the exhaust pipe 13 through the spaces separating the wafers 10.

Figure 4:
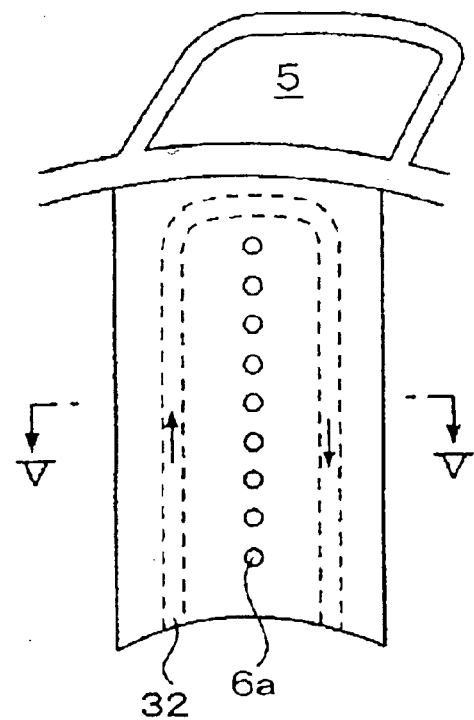
FIG. 4 is an enlarged schematic perspective view of the first chamber of FIG. 1, illustrating the method of indirectly cooling gas.
Figure 5:
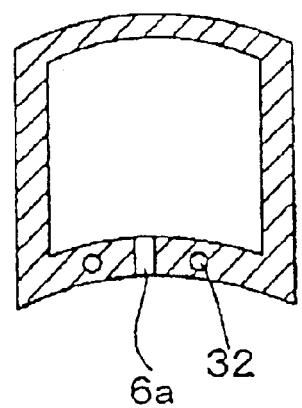
FIG. 5 is a schematic cross sectional view taken along line V—V in FIG. 4.

FIGS. 4 and 5 schematically illustrate a method of cooling the reaction product and gas by causing water at temperature between 283 K and 288 K to flow through a cooling medium flow path 32 formed in one of the walls of the chambers. More specifically, the cooling medium flow path 32 is realized in the form of inverted U and arranged in the partition plate 6 of the first chamber 5 in such a way that it surrounds the ejection ports 6a. Microwave-excited gas that is indirectly cooled by cooling water is made to react typically with $NF_3$ in the second chamber 22 without losing its excited state. Thus, the reaction product also contacts with the wafers 10 at temperature slightly lower than the room temperature.

INDUSTRIAL APPLICABILITY

As described above, the present invention makes it possible to remove the native oxide film on a batch basis so that it can greatly increase throughput in manufacturing of semiconductor devices.

What is claimed is:

1. A method of treating the surface of semiconductor by means of the reaction product of a first microwave-excited gas containing at least a gas selected from hydrogen, ammonia and nitrogen and a second gas of a fluorine-containing compound containing neither carbon nor oxygen in a reactor containing semiconductor silicon wafers with native oxide film and/or scum formed in contact holes thereof, characterized in that said reaction product is introduced substantially horizontally into the reactor by way of a chamber arranged as an extension thereof in the vertical direction of the reactor and showing an Internal pressure higher than that of the reactor, while many silicon wafers that are arranged in the vertical direction and held to temperature not higher than 323 K are being rotated, and subsequently said reactor is heated to above 373 K.

2. The method according to claim 1, wherein a first gas is introduced into a first chamber that (a) is arranged as an extension thereof in the vertical direction of the reactor and (b) has a plurality of first ejection ports arranged in row and held open relative to the second chamber as defined hereinafter and a second gas is introduced into a second chamber that (c) is arranged as an extension thereof in the vertical direction of the reactor and (d) has a plurality of second ejection ports arranged in row and held open relative to the reactor, (e) the internal pressure of said second chamber being between that of the first chamber and that of the reactor.

3. The method according to claim 1, wherein said heating above 373 K is realized by using a lamp arranged in the reactor.

4. The method according to claim 1, wherein a cooling medium is made to flow in one of the walls defining both or either of the first and second chambers to cool the first and/or second gas to below 323 K.

5. The method according to claim 1, wherein cooling gas is introduced into said reactor before introducing the reaction product.

6. A method of treating the surface of semiconductor by means of the reaction product of a first microwave-excited gas containing at least a gas selected from hydrogen, ammonia and nitrogen and a second gas of a fluorine-containing compound containing neither carbon nor oxygen in a reactor containing semiconductor silicon wafers with native oxide film and/or scum formed in contact holes thereof characterized in that a first gas is introduced into a first chamber that (a) is arranged as an extension thereof in the vertical direction of the reactor and (b) has a plurality of first ejection ports arranged in row and held open relative to the reactor, (c) the internal pressure of said first chamber being higher than that of the reactor, and a second gas is introduced into a second chamber that (d) is arranged as an extension thereof in the vertical direction of the reactor as and (e) has a plurality of second ejection ports arranged in row and held open relative to the reactor, (f) the internal pressure of said second chamber being higher than that of the reactor, while many silicon wafers that are arranged in the vertical direction and held to temperature not higher than 323 K are being rotated, and subsequently said semiconductor reactor is heated to above 373 K.

7. The method according to claim 6, wherein said heating above 373 K is realized by using a lamp arranged in the reactor.

8. The method according to claim 6, wherein
a cooling medium is made to flow in one of the walls defining both or either of the first and second chambers to cool the first and/or second gas to below 323 K.

9. The method according to claim 6, wherein
cooling gas is introduced into said reactor before introducing the reaction product.

* * * * *